United States Patent [19]

Boyd

[11] 4,317,083
[45] Feb. 23, 1982

[54] BIAS ADJUSTMENT RESPONSIVE TO SIGNAL POWER

[75] Inventor: William M. Boyd, Washington, Pa.

[73] Assignee: RCA Corporation, New York, N.Y.

[21] Appl. No.: 98,926

[22] Filed: Nov. 30, 1979

[30] Foreign Application Priority Data

Mar. 19, 1979 [GB] United Kingdom ............... 09624/79

[51] Int. Cl.$^3$ ............................................. H03F 3/24
[52] U.S. Cl. .................................... 330/296; 455/127
[58] Field of Search ............... 330/129, 278, 279, 285,
330/296; 358/175; 455/127, 245, 244, 235, 250

[56] References Cited

U.S. PATENT DOCUMENTS

| | | | |
|---|---|---|---|
| 3,443,241 | 5/1969 | Pitzalis, Jr. | 330/285 |
| 3,497,822 | 2/1970 | Beurrier | 330/296 |
| 3,714,601 | 1/1973 | Minton et al. | 330/285 X |

*Primary Examiner*—James B. Mullins
*Attorney, Agent, or Firm*—Eugene M. Whitacre; Paul J. Rasmussen; William H. Meise

[57] ABSTRACT

A distortion correction arrangement for a power amplifier which uses transistors is described. Biasing circuits are coupled to the transistor for biasing a transistor into a low-distortion conduction condition. The conduction condition of the transistor changes in response to the signal power being handled. Changes in signal power may therefore change the conduction condition to one of higher distortion. Bias control circuits are coupled to the transistor and to the bias circuit for controlling the bias in response to the signal power being handled. In a particular embodiment of the invention, the bias control circuits additionally respond to the rate of change of the signal power.

3 Claims, 7 Drawing Figures

BIAS ADJUSTMENT RESPONSIVE TO SIGNAL POWER

BACKGROUND OF THE INVENTION

This invention relates to arrangements for biasing power active devices such as transitors and for changing the bias from moment to moment in response to the signal power being handled by the amplifier or apparatus in which the active device is incorporated.

Active electronic devices such as vacuum tubes, bipolar and field-effect transistors and the like have nonlinear transfer functions. Very often, as with small-signal applications, the signal excursion is sufficiently small so that a portion of the transfer characteristic of the active device can be selected which is approximately linear. The active device is biased to that portion of the characteristic and the signal excursions about that point are sufficiently linear for the intended application. In other applications, it may be necessary to select among active devices to find those which are sufficiently linear for the intended purpose. In still other applications, the nonlinearity of the transfer function can be suppressed by trading gain for linearity, as with degenerative feedback and more recently with feedforward distortion compensation.

Power amplifiers pose a more severe distortion problem than do small-signal amplifiers. Generally speaking, the output signal excursions are large and may encompass a substantial portion of the entire useful characteristic. The internal power dissipation of the power active device is generally relatively large, which forces the physical dimensions of the active device itself (for example, the dimensions of the transistor chip) to be large to allow sufficient area for conducting away the heat to prevent damage to the device. Such larger active devices tend to require compromises in their design which reduces their overall gain. Consequently, the input signal required to drive the active device to produce the rated power output will be larger than in the case of a small-signal device, and thus the signal excursions at the input of the device are larger than in small-signal devices which exacerbates the linearity problem. The relatively low gain of the power devices and their large cost makes feedback and feedforward distortion correction schemes unattractive. Feedback and feedforward may also be disadvantageous for other reasons, as for example, because of high-frequency phase shift considerations. Consequently, the active devices in many applications, as for radio and television transmitters and the like are provided with distortion compensators which predistort the signal applied to the power device to compensate for the expected distortion when the power device is operated at a bias current and voltage level which provides optimum distortion.

It has been discovered, however, that the bias current and voltage of the active device may change during operation in response to the signal level being handled by the device. Thus, the power device deviates from the optimum bias point for which the predistortion was designed, with the result that substantial degradation of the distortion results. It is desirable to compensate for the distortion-causing effect of signal-dependent changes in the operating point of a power device.

SUMMARY OF THE INVENTION

A distortion correction arrangement for a power apparatus utilizing transistors includes bias circuits coupled to the transistor for biasing the transistor into a low distortion conduction condition. The conduction condition of the transistor changes in response to the signal power being processed, as by amplification. The change in conduction condition causes increased distortion, for example, differential gain. A bias control circuit is coupled to the transistor and to the bias circuits for sensing the signal power level and for controlling the bias in response to the signal power level for maintaining the low distortion conduction condition.

DESCRIPTION OF THE INVENTION

Figure 1:
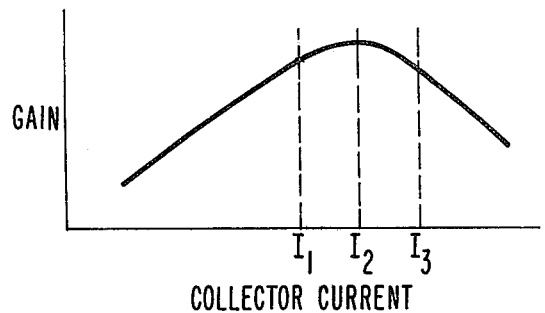
FIG. 1 is a plot of the current gain of a transistor device as a function of collector current.
Figure 3:
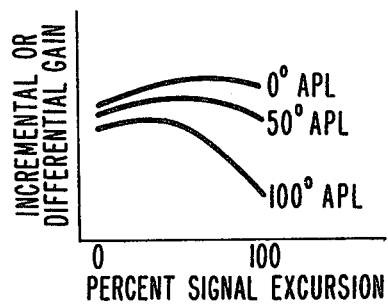
FIG. 3 illustrates the changes in incremental or differential gain of a television power transmitter as a function of percent of signal level for several average picture levels of the television signals being processed.

FIG. 1 illustrates that the current gain of a bipolar transistor depends upon collector current. At some collector current $I2$ the gain is a maximum, and increases or decreases of the collector current above and below this value resulting in reduced gain. A normal signal excursion may extend about optimum current $I2$, as between current values $I1$ and $I3$. The incremental current gain decreases at the lowest collector current excursion $I1$ as well as at the highest current $I3$. Since the highest incremental current gain is near current $I2$ on which the signal is centered, the signal portions having amplitudes near the current value $I2$ will be relatively stretched compared with those portions of the signal excursion having values near currents $I1$ and $I3$ which are relatively compressed. Other bias points are often used. For example, it is possible to bias quiescently at either $I1$ or $I3$, which will cause a unidirectional change in incremental gain about the quiescent points. A bias adjustment of a class AB amplifier will result in a differential gain change as shown in FIG. 3. Active devices other than bipolar transistors, generally speaking, also have nonlinear transfer functions.

Figure 2:
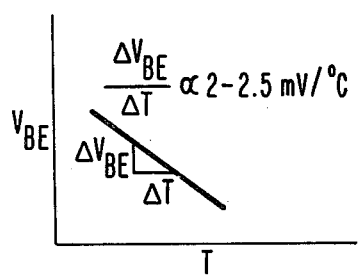
FIG. 2 is a plot of base-emitter offset voltage of a transistor device as a function of device temperature.

It is well known that the power dissipated within the active device of an amplifier changes in response to the power supplied to the load. For example, in a class A amplifier, the active device dissipation is maximum under no-signal conditions and decreases when signal is supplied to a load. In class AB and B amplifiers, collector dissipation is least under no-signal conditions and increases in the presence of a signal. Such changes in the power dissipation with changes in signal level affect the power dissipated within the active device. This in turn may change the characteristics of the device in a manner which perturbs the biasing. In the case of a bipolar transistor, for example, the base-emitter voltage is temperature-sensitive and has a negative characteristic as illustrated in FIG. 2. When a power bipolar transistor is biased by a voltage source applied across the base-emitter junction, even a small change in the base-emitter offset voltage may cause undesirably large changes in collector current.

When television signals are translated through an active device, the average signal level may change as the luminance takes excursions from black level to white level. Thus, there are variations in the power dissipation during a horizontal line. The top of a raster may often have a different luminocity than the bottom, as where sky and earth are imaged. This causes signal power changes with intervals having durations of milliseconds, and similarly scene changes may cause power-level variations having durations on the order of seconds.

Measurements have been made of the incremental or differential gain distortion occurring in a radio-frequency transmitter using a bipolar transistor output stage. FIG. 3 illustrates the distortion obtained at various average picture levels (APL). These measurements are made by operating the transmitter for a relatively long interval with a television signal transmitting a black, (0% APL) gray (50% APL) or white (100% APL) field, and interrupting the signal for the duration of one horizontal line and inserting during that line a conventional stairstep by which differential gain is measured. For the purpose of these tests, the bias condition was optimized at the 50% APL condition. As illustrated in FIG. 3, substantial differences in distortion occur with changes in picture content. While it may be possible to predistort the signal so as to compensate for the signal distortion at one power level, the changes in the distortion with power level reduce the effectiveness of this approach.

Figure 4:
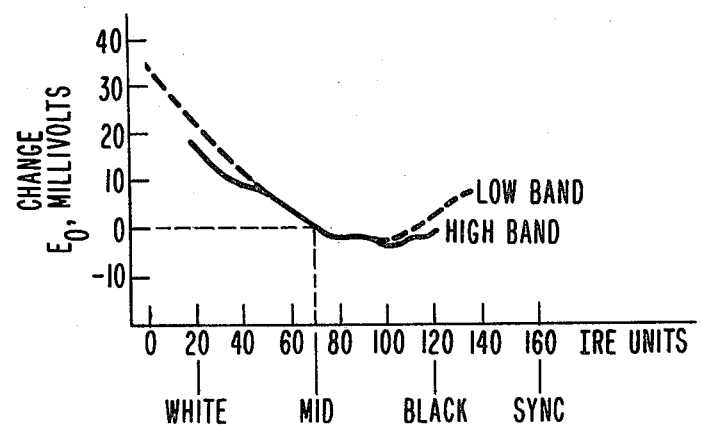
FIG. 4 is a plot of experimental data taken on the transmitter of FIG. 3 relating to the correction voltage required at the base of a transmitter power transistor to the average picture level of the television signal being processed.

FIG. 4 illustrates the polarity and magnitude of the correction required from the optimum base bias voltage in the aforementioned transmitter to maintain constant distortion nothwithstanding changes in signal level. The bias current, as before, was initially optimized at a mid-power condition. As illustrated in FIG. 4, changes in power level from a mid-power gray picture to a white picture requires a change in base bias voltage of approximately 20 millivolts for compensation for high and low-band television power transmitters. With black picture, on the other hand, a correction of about 2 millivolts (mv) in the negative direction is required for high-band systems and about +2 mv for low-band systems. The actual correction voltage (magnitude and/or shape) for a constant linearity may be different for various device types.

The corrections illustrated in FIG. 4 are those required under long-term conditions. There are, however, a number of different thermal time constants associated with the transistor chip which affect the rate of change of temperature. Those time constants associated with the transistor junction or chip, including substrate balancing resistors, have relatively fast time constants ranging from microseconds to milliseconds. The transistor package has a medium time constant, ranging from milliseconds to seconds. The heat sink to which the package is affixed has a relatively slow time constant, on the order of seconds to minutes. While a coarse compensation for transistor junction temperature may be based upon the long-time-constant corrections illustrated in FIG. 4, a better correction for the actual temperature of the junction using the modulation of the signal being translated as the input variable takes into account some heating time constants.

Figure 5:
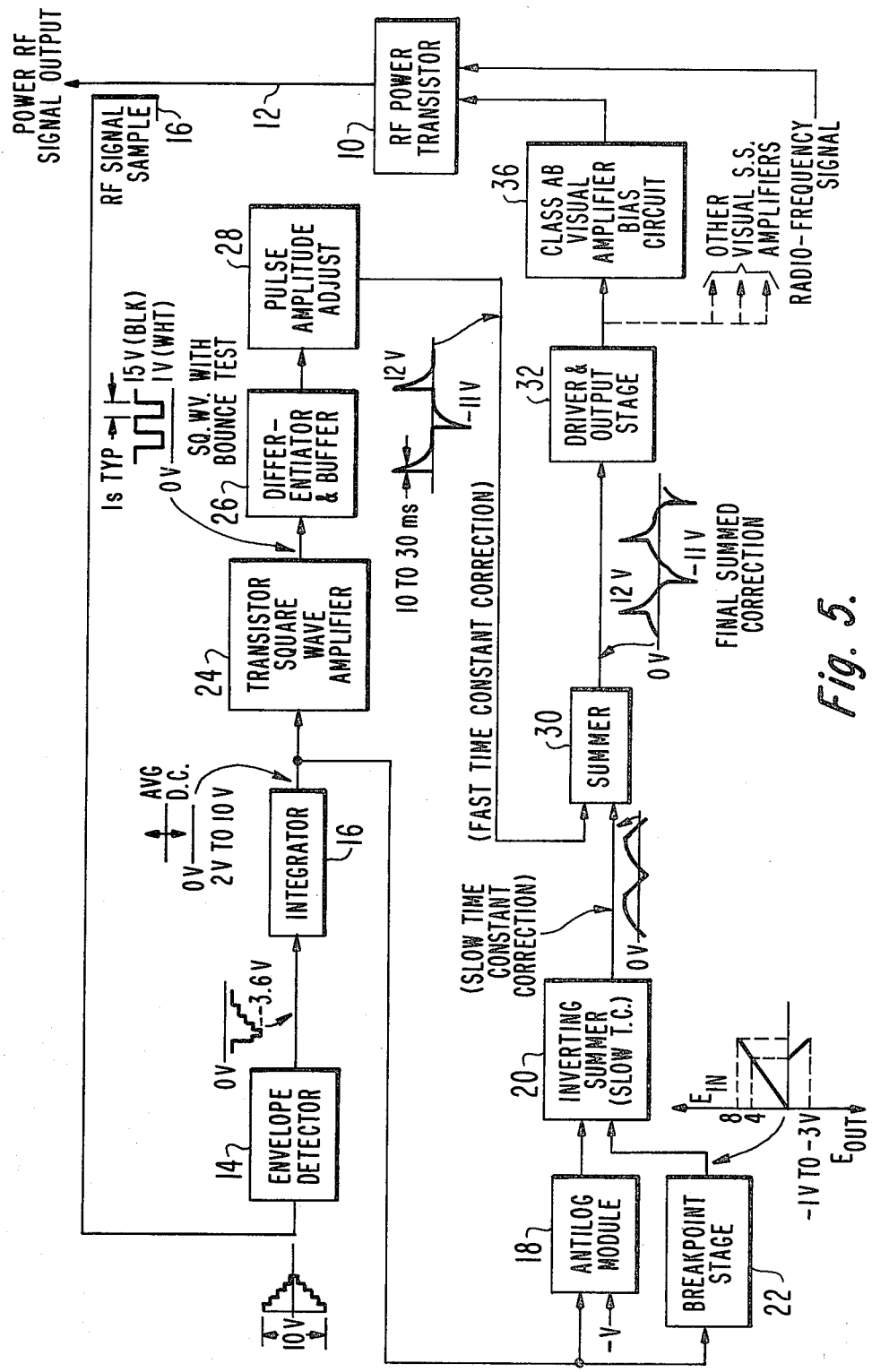
FIG. 5 is a block diagram of a portion of a television transmitter embodying the invention.

In FIG. 5, a radio-frequency signal is applied to a radio-frequency output transistor 10 for translation to an output conductor 12. A sample of the radio-frequency output signal is applied to a diode envelope detector 14 at upper left of FIG. 5 by way of an RF signal sampler 16. Envelope detector 14 demodulates the radio-frequency output signal to produce a replica of the modulation, which is related to the power dissipated in power transistor 10. The remainder of the arrangement of FIG. 5 is an open-loop compensation circuit coupled to the bias supply of power transistor 10 for correcting the base voltage in response to the video modulation of the radio-frequency signal to compensate for the changes in base-emitter voltage of output transistor 10 resulting from temperature changes in response to the amplitude of the radio-frequency signal.

The output of envelope detector 14 is coupled to an integrator 16 which integrates the modulation to produce a signal indicative of the slower or longer-interval power variation. The output of integrator 16 is coupled to an antilog module 18 at lower left of FIG. 5 which applies a logarithmic conversion to the integrated control voltage to create an output signal having a slope which is approximately the inverse of the slope of the high-band correction curve illustrated in FIG. 4. The converted signal is applied to an inverting integrator stage 20 to produce a slow time constant correction signal suitable for the measured bias change in a particular high-band television transmitter output transistor.

As may be noted from FIG. 4, the transmitter used for low-band television operation has a somewhat different curvature than the correction for the high-band. The breakpoint and difference in slope in the region of 40 IRE units in FIG. 4 is compensated for by a breakpoint stage 22 coupled in parallel with antilog module 18. At a particular input voltage corresponding to the breakpoint, stage 22 begins to produce an output signal which is coupled to stage 20 for summing with the output signal of module 18. Thus, the changes in bias voltage resulting from relatively slow time-constant heating effects may be compensated.

As previously mentioned, the heating effect resulting from short time-constant power-level changes may also be compensated. A high-gain amplifier 24 has its input coupled to the output of integrator 16 for amplifying the output of integrator 16 and driving a differentiator 26. Amplifier 24 is arranged to saturate with modulation changes from 0 to 100% APL in either direction (bounce test). Differentiator 26 operates on the amplified integrated modulation to produce differentiated pulses representative of fast changes in the modulation which in turn are indicative of fast changes in the power dissipated in transistor 10. The pulses are applied through an amplitude adjustment stage 28 to a second input of a further summing amplifier 30 to produce an output signal representative of the short and long-term power changes. The output of amplifier 30 is coupled to the base of transistor 10 by means of a driver and output stage 32 and bias circuit 36.

Figure 6:
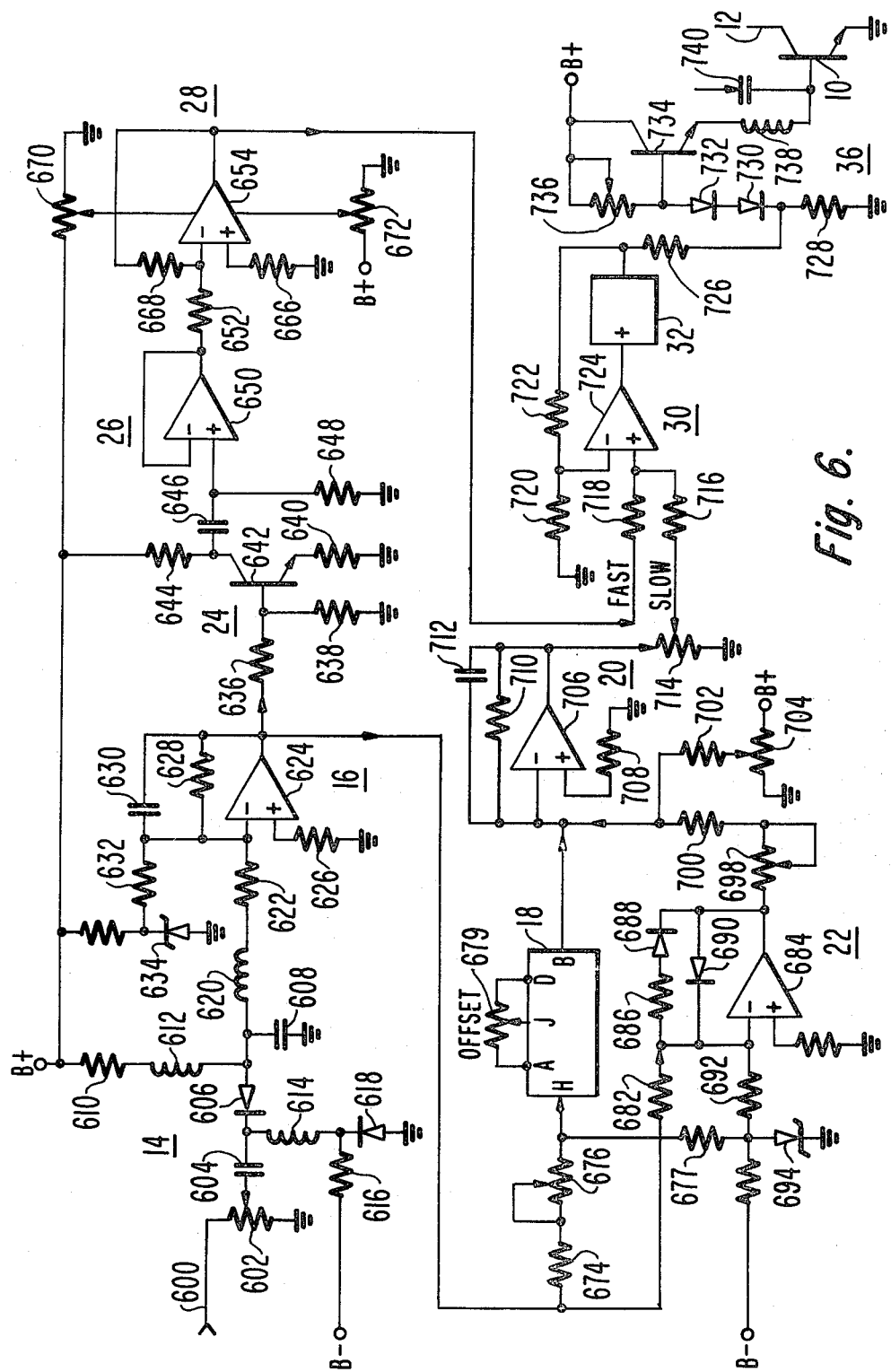
FIG. 6 provides schematic detail of portions of the arrangement of FIG. 5.

FIG. 6 illustrates in schematic detail portions of the arrangement of FIG. 5. In FIG. 6, an input terminal 600 at upper left receives radio-frequency signals from sampler 16 and couples them to a level adjustment potentiometer 602 which is matched to the input transmission-line impedance. The RF signals are coupled through a capacitor 604 to a detector diode 606 which rectifies the signal. A capacitor 608 strips off the RF carrier. A bias circuit consisting of resistors 610 and 616, inductors 612 and 614 and a diode 618 biases the anode of detector diode 606 toward ground potential. Diode 618 tends to temperature-compensate for diode detector 606. The detected modulation is coupled through an inductor 620 to integrator 16, which includes an amplifier 624, the gain of which is controlled by resistors 622 and 628 and a capacitor 630. The output of integrator 16 is offset by a bias circuit including zener diode 634 and a resistor 632 coupled to the inverting input of the amplifier. The output of amplifier 16 is coupled by way of resistor 674 and scale-factor adjustment potentiometer 676 to the input of an antilog module 18, the output of which is coupled to the inverting input of summing amplifier 20. The output of amplifier 16 is also coupled to the inverting input of an operational amplifier 684 of breakpoint stage 22 by way of a resistor 682. Resistor 682 forms, with resistor 692 and a voltage source including a zener diode 694, a bias network which tends to drive the inverting input of amplifier 684 negative. However, degenerative feedback through diode 690 prevents the output of amplifier 684 from dropping below ground. Until the signal applied to the input of breakpoint stage 22 can raise the voltage at inverting input of amplifier 684 above ground, no output signal results, as illustrated by waveform 23 of FIG. 5. When the output signal is high enough, the output of amplifier 684 goes negative, diode 690 becomes nonconductive, diode 688 becomes conductive and the gain of breakpoint stage 22 is controlled by resistors 682, 686 and 692. The output of stage 22 is applied to the inverting input of summer 20 by means of resistors 698 and 700. A bias voltage is also applied to the input of summer 20 from a potentiometer 704 by way of a resistor 702. The three input signals applied to the inverting input of amplifier 706 are integrated and inverted before being applied by way of a level adjust potentiometer 714 to a summing amplifier 30 where the slow time constant signal is combined with the fast time constant signal.

The output signal from integrator 16 is also applied by way of a voltage divider 636, 638 to the base of a transistor 642 of amplifier 24. The gain of the stage is controlled by resistors 640 and 644. The output of amplifier 24 is applied to differentiator 26 which consists of capacitor 646 and a resistor 648 and the output of which is buffered by an amplifier 650. The output of differentiator 26 is coupled to pulse amplitude adjust circuit 28 which includes an operational amplifier 654, the supply voltages of which may be adjusted by means of potentiometers 670 and 672. The gain of amplifier 654 is controlled by resistors 652 and 668. Adjustment of resistors 670 and 672 controls the maximum voltage to which the output of amplifier 654 can be driven. The output of adjustment stage 28 is applied by way of a resistor 718 to summer 30. Summer 30 is coupled in a feedback loop with driver and output stage 32. The output of the combined summer, driver and output stage drives a voltage divider of bias circuit 36 consisting of resistor 726 and 728 to produce an attenuated control signal across resistor 728. The control signal is translated through diodes 730 and 732 to the base of an emitter-follower 734. The emitter of transistor 734 is coupled through an RF choke 738 to the base of transistor 10. The nominal conduction level of transistor 10 is set by a resistor 736 coupled to the base of transistor 734. The incremental bias changes in response to signal modulation are superimposed upon this basic conduction level. Radio-frequency signals are applied to the base of transistor 10 through a capacitor 740.

Figure 7:
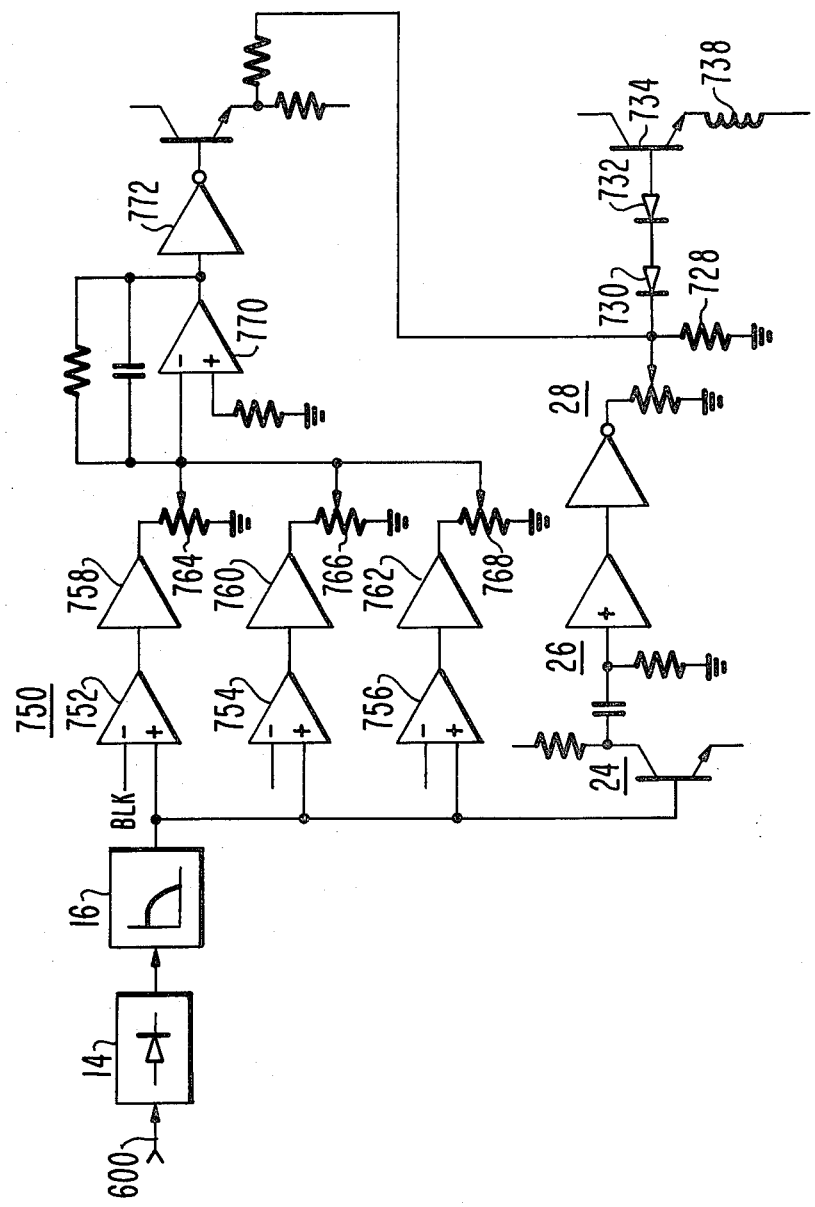
FIG. 7 illustrates another embodiment of the invention.

FIG. 7 illustrates a quasi-digital arrangement for producing a correction curve similar to the curve of FIG. 4. In FIG. 7, elements corresponding to those of FIG. 6 have the same reference number. Modulation detected by detector 14 and processed by integrator 16 is applied in parallel to a plurality of comparators 752–756 of a nonlinear processor 750 for comparison with reference voltages representing various selected video levels representative of RF power levels. The outputs of the comparator are passed through amplitude controls 764–768 and summed in a summing integrator 770. Processor 750 produces a nonlinear control signal generally corresponding to that produced by antilog module 18 and breakpoint stage 22, and is summed with modulation processed by amplifiers 24 and 28 and by differentiator 26 for application to the base of transistor 10.

Other embodiments of the invention will be obvious to those skilled in the art. As illustrated in FIG. 5, a plurality of power transistors may have the same control signal coupled to their bases. Also, since the control signal required to compensate for heating effect of the active device depends upon the type of device and upon its geometry and the geometry of its mounting, it is anticipated that other forms of correction signal both as to time constant and correction polarity will be required. In a particular embodiment of the invention, the following values were found to provide satisfactory operation:

| B+, B− | ± 15 volts |
|---|---|
| RESISTORS | OHMS |
| 602 | 50 |
| 610,628 | 39k |
| 616,666 | 4700 |
| 622 | 6800 |
| 626 | 7500 |
| 632 | 24k |
| 636,668,676,682,692 | 10k |
| 638 | 3k |
| 640 | 75 |
| 644 | 1200 |
| 648 | 4.7M |
| 652 | 8200 |
| 670,672,704,718,708 710,722,716,720 | 1k |
| 674 | 42k |
| 677 | 34k highband, 33k lowband |
| 679 | 25k |
| 686 | 4700 highband, 14.7k lowband |
| 698 | 2k |
| 700 | 470 |
| 702 | 560 |
| 714 | 5k |
| 726 | 330 |
| 728 | 1 |
| CAPACITORS | |
| 604 | 1000pF |
| 608 | 27pF |
| 630 | 0.47μF |
| 646 | 0.015μF |
| 712 | 660μF |
| ACTIVE DEVICES | |
| Diodes 606,618,688,690 | Hewlett-Packard 2835 |
| Zener 634 | 3.3v |
| Zener 694 | 8.4v |
| Antilog module | Analog Devices 752N |

What is claimed is:

1. An improved base-emitter bias voltage correction arrangement for a power transistor adapted for processing signals carrying modulation which produces a varying average power level, which modulation perturbs the base-emitter offset voltage of said transistor and results in increased distortion, the arrangement comprising:

bias means having a first input terminal coupled with the base-emitter junction of the transistor and also having an output terminal, said first input terminal of said bias means being coupled to a voltage source for producing a base-emitter bias voltage for biasing said transistor into a low-distortion conduction condition, said output terminal coupling said base-emitter bias voltage to said base-emitter junction for maintaining said base-emitter bias voltage at low frequencies notwithstanding the effects of application of input signals to said base-emitter junction;

the improvement comprising;

envelope detection means coupled to the signal path for producing a baseband replica of the modulation;

a second input terminal of said bias means;

signal processing means coupling said envelope detection means with said second input terminal of said bias means for processing said replica of said modulation for producing a second bias control signal; and wherein said improvement further lies in that said second bias control signal coupled to said second input terminal of said bias means is superposed upon said base-emitter bias voltage thereby varying said base-emitter bias voltage as a function of said modulation for compensating said base-emitter bias voltage for the changes in the base-emitter offset voltage resulting from the power changes resulting from said modulation whereby said low-distortion conduction condition is maintained.

2. An arrangement according to claim 1 wherein said signal processing means is responsive to the time rate of change of said signal power level.

3. An arrangement according to claim 1 or 2 wherein said transistor is a bipolar transistor, and said bias means increases said base-emitter bias applied to said base-emitter junction of said transistor when the signal power coupled to the load on said transistor is reduced.

* * * * *